United States Patent
Shinozaki et al.

(10) Patent No.: US 10,383,262 B2
(45) Date of Patent: Aug. 13, 2019

(54) POWER CONVERSION DEVICE

(71) Applicant: MITSUBISHI ELECTRIC CORPORATION, Chiyoda-ku (JP)

(72) Inventors: Masaru Shinozaki, Chiyoda-ku (JP); Shigetoshi Ipposhi, Chiyoda-ku (JP); Hiroyuki Higashino, Chiyoda-ku (JP); Yugo Asai, Chiyoda-ku (JP); Hiroyuki Yano, Chiyoda-ku (JP); Haruyuki Matsuo, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 15/549,821

(22) PCT Filed: Mar. 25, 2015

(86) PCT No.: PCT/JP2015/059167
§ 371 (c)(1),
(2) Date: Aug. 9, 2017

(87) PCT Pub. No.: WO2016/151804
PCT Pub. Date: Sep. 29, 2016

(65) Prior Publication Data
US 2018/0027704 A1    Jan. 25, 2018

(51) Int. Cl.
*H05K 7/20*    (2006.01)
*H02M 7/00*    (2006.01)
*H05K 5/03*    (2006.01)

(52) U.S. Cl.
CPC ........ *H05K 7/20927* (2013.01); *H02M 7/003* (2013.01); *H05K 5/03* (2013.01); *H05K 7/209* (2013.01)

(58) Field of Classification Search
CPC .......... H05K 7/20927; H05K 7/20254; H05K 7/209; H05K 5/03; H01L 23/473; H01L 9/52; H02M 7/003
(Continued)

(56) References Cited

U.S. PATENT DOCUMENTS 4,377,198 A * 3/1983 Welling ................ F28D 15/04
165/104.11
4,581,695 A * 4/1986 Hoppe ................ H02K 11/042
310/68 D
(Continued)

FOREIGN PATENT DOCUMENTS

CN    103839904 A    6/2004
CN    102169858 A    8/2011
(Continued)

OTHER PUBLICATIONS

International Search Report dated Jun. 16, 2015, in PCT/JP2015/059167, filed Mar. 25, 2015.
(Continued)

*Primary Examiner* — Dion Ferguson
*Assistant Examiner* — Amir A Jalali
(74) *Attorney, Agent, or Firm* — Oblon, McClelland, Maier & Neustadt, L.L.P.

(57) ABSTRACT

The power conversion device of the invention includes: a cooling unit that is a prism, the interior of which is hollow, and that has a refrigerant inlet portion and a refrigerant outlet portion the cooling unit having in the interior thereof a refrigerant channel through which a refrigerant flows from the refrigerant inlet portion towards the refrigerant outlet portion; electronic devices that are respectively disposed on three or more surfaces on the outside of side surfaces of the cooling unit, excluding a refrigerant inlet surface, in which the refrigerant inlet portion is disposed, and a refrigerant
(Continued)

outlet surface, in which the refrigerant outlet portion is disposed, the electronic devices being cooled by boiling of the refrigerant; and a hollow outer case 4 that covers the electronic devices.

10 Claims, 15 Drawing Sheets

(58) Field of Classification Search
USPC .......... 361/699, 702; 165/80.4–80.5, 104.33
See application file for complete search history.

(56) References Cited

U.S. PATENT DOCUMENTS

| | | | | |
|---|---|---|---|---|
| 5,204,806 | A * | 4/1993 | Sasaki | H05K 1/189 361/749 |
| 5,586,004 | A * | 12/1996 | Green | H05K 7/20536 165/80.3 |
| 6,002,183 | A * | 12/1999 | Iversen | H01L 23/467 257/691 |
| 6,501,653 | B1 * | 12/2002 | Landsgestell | H02M 7/003 165/185 |
| 7,059,137 | B2 * | 6/2006 | Childress | B60H 1/00264 62/259.2 |
| 7,539,016 | B2 * | 5/2009 | Sauciuc | F28D 15/0266 257/714 |
| 2007/0284157 | A1 * | 12/2007 | Heller | H02K 7/006 180/54.1 |
| 2009/0231812 | A1 * | 9/2009 | Wiles | H01L 23/3735 361/699 |
| 2009/0284923 | A1 * | 11/2009 | Rytka | H05K 7/20927 361/700 |
| 2010/0232106 | A1 * | 9/2010 | Kauranen | H05K 7/20918 361/692 |
| 2011/0188204 | A1 * | 8/2011 | Horiuchi | H01L 23/473 361/702 |
| 2012/0273164 | A1 * | 11/2012 | Vetrovec | H01L 23/473 165/104.13 |
| 2012/0279761 | A1 * | 11/2012 | Hori | H01L 21/4878 174/252 |
| 2014/0158324 | A1 * | 6/2014 | Tochiyama | H05K 7/20281 165/67 |
| 2014/0313806 | A1 | 10/2014 | Shinohara et al. | |
| 2016/0088778 | A1 * | 3/2016 | Geisler | H05K 7/20927 361/699 |

FOREIGN PATENT DOCUMENTS

| | | | | |
|---|---|---|---|---|
| JP | 1-230298 A | | 9/1989 | |
| JP | 03-153095 A | * | 1/1991 | ............... H05K 7/20 |
| JP | 3-153095 A | | 7/1991 | |
| JP | 2008-294196 A | | 12/2006 | |
| JP | 2011-29480 A | | 2/2011 | |
| JP | 2011-109740 A | | 6/2011 | |
| JP | 2012-239255 A | | 12/2012 | |
| JP | 2013-94022 A | | 5/2013 | |
| JP | 2013-179104 A | | 9/2013 | |
| JP | 2014-230458 A | | 12/2014 | |

OTHER PUBLICATIONS

Chinese Office Action issued in Chinese Patent Application No. 201580078007.8 dated Jan. 11, 2019 (w/ English translation), citing reference AO and AP therein.

* cited by examiner

POWER CONVERSION DEVICE

TECHNICAL FIELD

The present invention relates to a power conversion device for converting power.

BACKGROUND ART

Conventional power conversion devices include for instance automotive power conversion devices mounted in electric cars or hybrid cars and in which an inverter device and a DC-DC converter device are integrated together.

Inverter devices and DC-DC converter devices ordinarily require cooling. Therefore, in many cases, a refrigerant channel, through which refrigerant for cooling flows, is formed inside a case within which the inverter device or the DC-DC converter device is disposed. Cooling structures have been disclosed wherein refrigerant channels are provided inside a C-shaped case, and for instance inductor elements and power semiconductor modules that generate comparatively large amounts of heat are disposed in the vicinity of the refrigerant channels, to increase thereby cooling efficiency (see for instance PTL 1).

Structures have also been disclosed in which flow channels are provided along heat dissipation surfaces on both surfaces of semiconductor modules, and cooling water is supplied to the flow channels, to increase thereby cooling efficiency (see for instance PTL 2).

CITATION LIST

Patent Literature

[PTL 1] Japanese Patent Application Publication No. 2013-94022 (paragraphs [0015] to [0017], [0090] and [0091], FIG. 11)
[PTL 2] Japanese Patent Application Publication No. 2011-109740 (paragraph [0073], FIG. 5)

SUMMARY OF INVENTION

Technical Problem

In such power conversion devices, a plurality of heat-generating electronic devices are disposed lined up on one same surface, and accordingly a resulting cooling unit has a flat structure. This is accordingly problematic in that a large surface area is required in order to install such a power conversion device being provided with a cooling unit.

Routing of refrigerant channels is complex in cases of cooling by refrigerant channels provided on both surfaces of an electronic device. A problem arises as a result in that the refrigerant channels adopt a very complex structure when laid around respective electronic devices.

An object of the present invention, arrived at in order to solve the above problems, is to provide a power conversion device that allows reducing the necessary footprint and simplifying the routing of a cooling flow channel.

Solution to Problem

The power conversion device according to the present invention includes: a cooling unit that is a prism, the interior of which is hollow, and that has a refrigerant inlet portion and a refrigerant outlet portion, the cooling unit having, in the interior thereof, a refrigerant channel through which a refrigerant flows from the refrigerant inlet portion towards the refrigerant outlet portion; electronic devices that are respectively disposed on three or more surfaces on the outside of side surfaces of the cooling unit excluding a refrigerant inlet surface, in which the refrigerant inlet portion is disposed, and a refrigerant outlet surface, in which the refrigerant outlet portion is disposed, the electronic devices being cooled by boiling of the refrigerant; and a hollow outer case that covers the electronic devices.

Advantageous Effects of Invention

With the power conversion device according to the present invention, a power conversion device can be realized that allows reducing the necessary footprint and simplifying tine routing of a cooling flow channel.

DESCRIPTION OF EMBODIMENTS

Embodiment 1

A power conversion device 1 according to Embodiment 1 of the present invention will be explained next with reference to FIGS. 1 to 5. In the figures, identical reference symbols denote identical or corresponding elements; the same applies to the entire text of the description.

Figure 1:
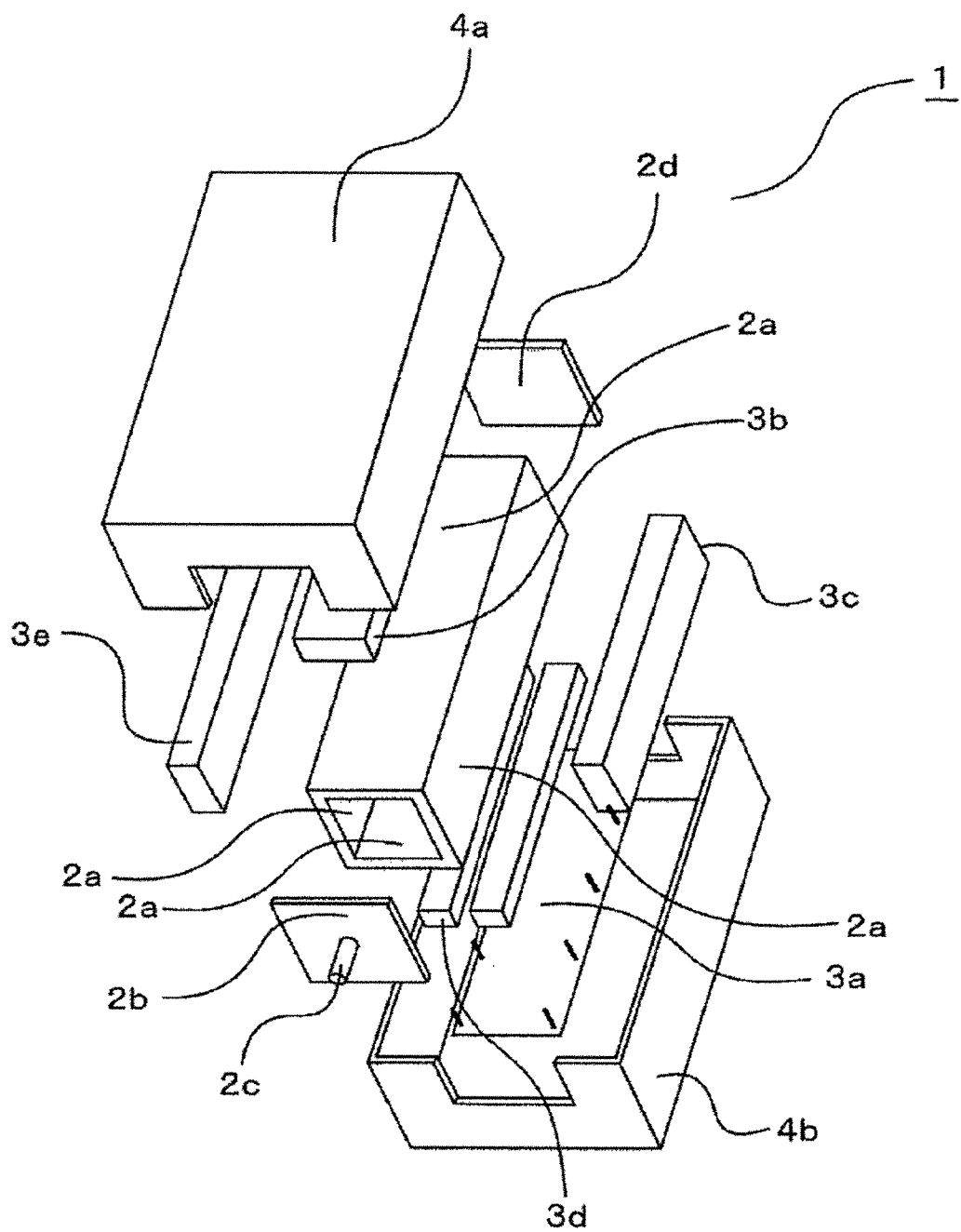
FIG. 1 is as exploded perspective-view diagram of a power conversion device according to Embodiment 1 of the present invention.
Figure 2A:
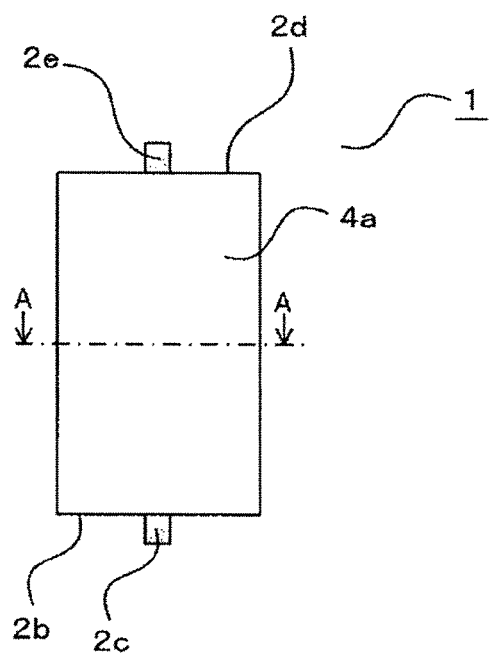
FIG. 2 is a set of a top-view diagram and an A-A cross-sectional diagram of the power conversion device according to Embodiment 1 of the present invention.
Figure 2B:
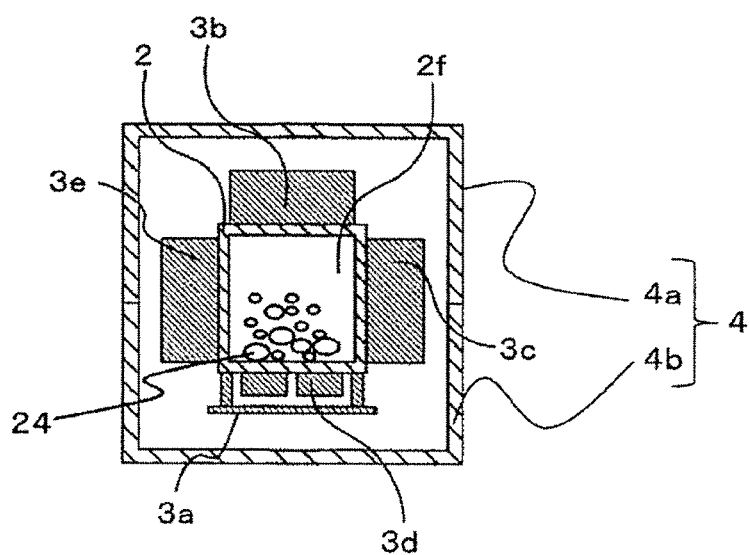

FIG. 1 is an exploded perspective-view diagram of the power conversion device 1 according to Embodiment 1 of the present invention. FIG. 2 is a set of a top-view diagram and an A-A cross-sectional diagram of the power conversion device 1 according to Embodiment 1 of the present invention, where FIG. 2A is a top-view diagram of the power conversion device 1 and FIG. 2B is a cross-sectional diagram of the power conversion device 1 along A-A of FIG. 2A.

The power conversion device 1 according to the present Embodiment 1 has mainly an outer case 4, a codling unit 2 and a plurality of heat-generating electronic devices 3. The cooling unit 2, which is exemplified in FIG. 1 in the form of a hollow quadrangular prism, has a cooling unit side surface 2a, a refrigerant inlet surface 2b, a refrigerant inlet portion 2c, a refrigerant outlet surface 2d, a refrigerant outlet portion 2e and a refrigerant channel 2f. One of the two mutually opposing end surfaces of the cooling unit 2 is the refrigerant inlet surface 2b, and the other surface is the refrigerant outlet surface 2d. The refrigerant inlet portion 2c, through which refrigerant flows in, is disposed in the refrigerant inlet surface 2b, and the refrigerant outlet portion 2e, through which refrigerant flows out, is disposed in the refrigerant outlet surface 2d. The refrigerant inlet portion 2c and the refrigerant outlet portion 2e are fittings for refrigerant piping.

For instance, the cooling unit side surface 2a is made up of flat surfaces of a quadrangular prism that are perpendicularly in contact with the refrigerant inlet surface 2b and the refrigerant outlet surface 2d in FIG. 1. That is, the cooling unit side surface 2a is the surface of the cooling unit 2 excluding the refrigerant inlet surface 2b in which the refrigerant inlet portion 2c is disposed and the refrigerant outlet surface 2d in which the refrigerant outlet portion 2e is disposed.

In a case where the power conversion device 1 is to be installed for instance in a vehicle, the surface at the top of the cooling unit side surface 2a, in the vertical direction, is the top surface, and the surface at the bottom is the bottom surface. The refrigerant channel if is the space in the hollow of the quadrangular prism surrounded by the refrigerant inlet surface 2b, the refrigerant outlet surface 2d and the cooling unit side surface 2a, such that the refrigerant channel 2f communicates with the fittings of the refrigerant inlet portion 2c and the of the refrigerant outlet portion 2e. Accordingly, the refrigerant channel 2f constitutes a flow channel of a shape that conforms to the outline of the cooling unit 2.

The cooling unit side surface 2a and the refrigerant inlet surface 2b, or the cooling unit side surface 2a and the refrigerant outlet surface 2d, are joined by way of an interposed sealing member such as an O-ring. For instance, a refrigerant pipe 40 such as a radiator hose is attached as the joining fitting of the refrigerant inlet portion 2c and the refrigerant outlet portion 2e, such that refrigerant circulates through the interior of the refrigerant channel 2f by way of a water pump 32 or a radiator 31. As the refrigerant there is used for instance water, LCC (antifreeze liquid diluted with water and having ethylene glycol as a main component) or oil.

A control circuit 3a, a driving circuit 3b, a capacitor 3c, a power module 3d, a step-down converter 3e or the like are disposed, as heat-generating electronic devices 3, on the outside of the cooling unit side surface 2a The electronic devices 3 are connected to load equipment, such as a motor 33, or to power supply equipment, such as a battery 34, for instance by way of a harness 41. The cooling unit 2 is formed out of a thin plate of metal, for instance aluminum, an aluminum alloy, or stainless steel. The electronic devices 3 need not be necessarily disposed on the cooling unit side surface 2a alone, and may be disposed also on the refrigerant inlet surface 2b or the refrigerant outlet surface 2d, if there is space to spare.

A method for producing the cooling unit side surface 2a will be explained next. As an example, the cooling unit side surface 2a is produced in accordance with a die cast manufacturing method illustrated below. To mold the cooling unit side surface 2a, a mold in the form of a movable die and a fixed the are prepared, and are respectively attached to a stationary platen and to a movable platen of a die casting machine. The movable die and the fixed die of the die casting machine are combined next, through displacement of the movable dies, and the dies are tightened against each other. Molten metal is press-injected into the resulting mold, and the latter is opened through displacement of the movable die once solidification is complete. The cooling unit side surface 2a becomes molded as a result. The cooling unit side surface 2a can be molded also by extrusion molding. For instance, a material is placed into a pressure-resistant formwork, and high pressure is exerted, to extrude the material thereby from a small gap having a constant cross-sectional shape. The cooling unit side surface 2a is then obtained through working to a desired shape. The cooling unit side surface 2a can be obtained through welding of plates, or can be formed through sealing and bolt fastening.

The positions of the refrigerant inlet surface 2b and of the refrigerant outlet surface 2d are not limited to both end surfaces of the cooling unit 2 being a quadrangular prism, and may be any positions on the surfaces that make up the cooling unit 2. Further the heat-generating electronic devices 3 may be disposed on at least three surfaces of the cooling unit side surface 2a.

The outer case 4, the interior of which is hollow, is provided so as to cover the electronic devices 3. An outer case top part 4a and a outer case bottom part 4b of the outer case 4 of the present Embodiment 1 are formed as separate bodies, and are attached to each other, protecting the resulting interior by flanking, from above and below, the cooling unit 2 having the electronic devices 3 disposed thereon. The external shape of the outer case 4 is substantially a quadrangular prism, which makes for easier handling during installation.

In the present Embodiment 1, the refrigerant inlet surface 2b and the refrigerant outlet surface 2d are not covered by the outer case 4, but are exposed to the exterior, forming a smooth surface with the surface of the outer case 4. Therefore, the outer ease top part 4a and the outer case bottom part 4b are formed to a C-shape, according to the shape of the refrigerant inlet surface 2b or the refrigerant outlet surface 2d. The outer case 4 is joined at the contact surface of the outer case top part 4*a* and the outer case bottom part 4*b,* and the outer case 4 and the cooling unit 2 are joined at the contact surface of the cooling unit 2 with the outer case top part 4*a* and the outer case bottom part 4*b,* as a result of which the interior of the outer case 4 becomes hermetically sealed.

The outer case 4 is formed out of a thin sheet of metal, for instance aluminum, an aluminum alloy of stainless steel. The electronic devices 3 attached to the cooling unit 2 are disposed so as not to come into contact with the outer case 4, in order to prevent short-circuits between the electronic devices 3 by way of the outer case 4. The refrigerant inlet surface 2*b* and the refrigerant outlet surface 2*d* need not necessarily for a smooth surface with the surf ace of the outer case 4. Herein at least one from among the refrigerant inlet surface 2*b* and the refrigerant outlet surface 2*d* may be positioned inward of the surface of the outer case 4, so that the interior of the outer case 4 can be sealed hermetically, by modifying as appropriate the shape of the outer case 4 so as to cover the cooling unit side surface 2*a* on which the electronic devices 3 are provided.

Air between the outer case 4 and the cooling unit 2 is confined in a sealed space. The temperature of the sealed air rises thus as a result of generation of heat by the electronic devices 3. The outer case 4 is made of metal, and thus the air in the sealed space can be cooled through exchange of heat with outside air, at the outer surface of the outer case 4. Air in the sealed space can also be cooled through exchange of heat with the surface of the cooling unit 2 that is not covered by the electronic devices 3. A relief or fins may be provided on the outer surface of the outer case 4, to promote heat exchange between outside air and the outer case 4.

Herein an instance of the power conversion device 1 according to the present Embodiment 1 is illustrated in which the shape of the cross-section of the refrigerant channel 2*f* in the cooling unit 2, i.e. the cross-sectional shape (shape of the A-A cross-section) of the cooling unit 2 parallel to the refrigerant inlet surface 2*b* or the refrigerant outlet surface 2*d* is square, as illustrated in FIG. 2(*b*). The cross-sectional shape may be rectangular or trapezoidal, so long as the heat-generating electronic devices 3 can be fixed to three or more surfaces oh the outside of the cooling unit side surface 2*a* In the present Embodiment 1, the distance between the outer case 4 and the cooling unit 2 is substantially same in all directions, except at the four corners. However, the distance need not necessarily be same, so long as the external shape of the outer case 4 makes for easy handling during installation.

Figure 3A:
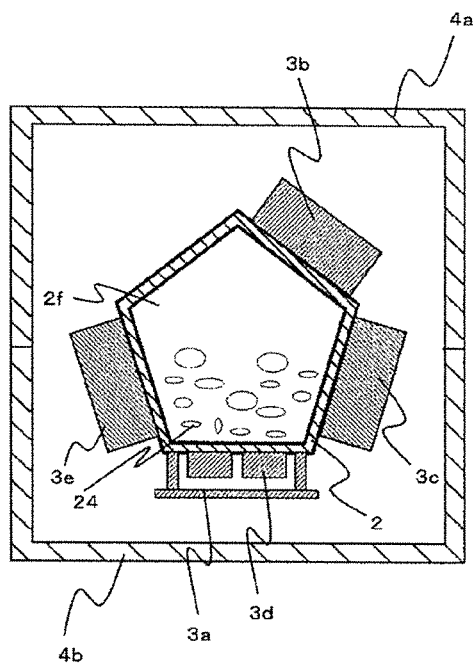
FIG. 3 is a set of variations of the shape of a cooling unit according to Embodiment 1 of the present invention.
Figure 3B:
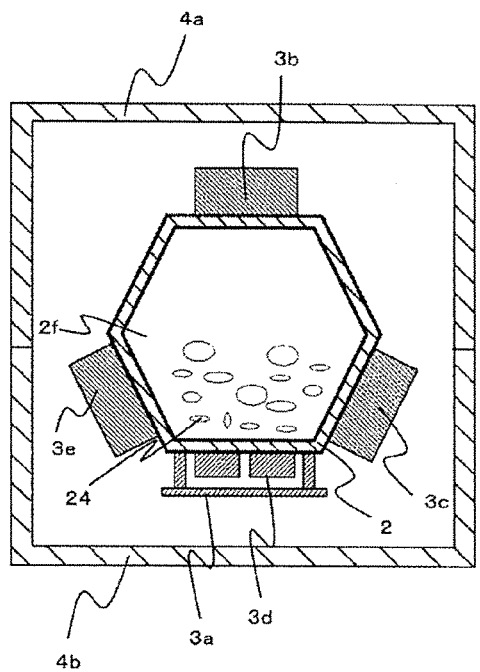

FIG. 3 is a set of variations of the shape of the cooling unit 2 according to Embodiment 1 of the present invention. Both FIG. 3A and FIG. 3B are cross-sectional diagrams at a position corresponding to position A-A of FIG. 2A. in FIG. 3A the cross-sectional shape of the cooling unit 2 is a pentagon, with heat-generating electronic devices 3 provided on the outside of the cooling unit side surface 2*a,* while in FIG. 3B the cross-sectional shape of the cooling unit 2 is a hexagon, with electronic devices 5 provided on the outside of the cooling unit side surface 2*a.* Although the cross-sectional shape of the cooling unit 2 at position in FIG. 2(*b*) is depicted as square, the cross-sectional shape of the cooling unit 2 at position A-A may be pentagonal or hexagonal, as illustrated in FIG. 3, or may be that of a prismatic shape made up a triangle or higher polygon.

Figure 4:
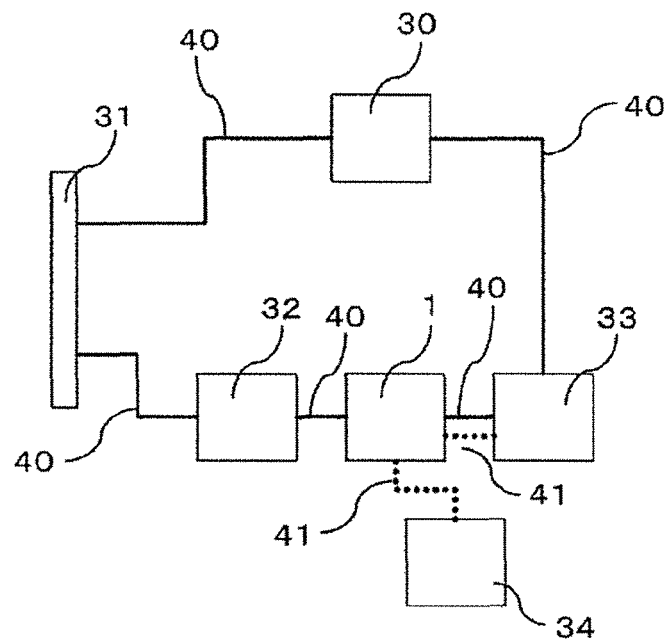
FIG. 4 is a block diagram illustrating an arrangement example of the power conversion device according to Embodiment 1 of the present invention.

FIG. 4 is a block diagram illustrating an arrangement example of the power conversion device 1 according to Embodiment 1 of the present invention. In FIG. 4, the power conversion device 1 is connected to the water pump 32 and the motor 33 by way of the refrigerant pipe 40. The motor 33 is disposed connected to the engine 30, the engine 30 to the radiator 31, and the radiator 31 to the water pump 32, by way of the refrigerant pipe 40. The power conversion device 1 is connected to the battery 34 and the motor 33 by way of the harness 41. FIG. 4 illustrates an arrangement example of the power conversion device 1, but the arrangement is not limited to that of FIG. 4, and the various devices may be combined The operation of the power conversion device 1 of Embodiment 1 of the present invention will be explained next. The various electronic devices 3, i.e. the control circuit 3*a,* driving circuit 3*b,* capacitor 3*c,* power module 3*d,* step-down converter 3*e* and so forth provided in the cooling unit 2 operate in order to drive the motor 33 and so forth. These electronic devices 3 generate heat according to the driving state.

The refrigerant can be caused to boil by being heated up, via the cooling unit side surface 2*a,* by the heat-generating electronic devices 3 disposed outside the cooling unit 2. As a result of such heating, the refrigerant boils up, accompanied by bubbles 24 at the cooling unit side surface 2*a* on which the heat-generating electronic devices 3 are provided, and a heat transfer coefficient increases on account for instance of latent heat derived from the phase change of the refrigerant, and on account of disturbances in the flow of refrigerant in the vicinity of the cooling wait side surface 2*a* on which the heat-generating electronic devices 3 are provided. The electronic devices 3 become cooled to or below a specified temperature. The amount of heat per unit surface area (heat flux) that is transmitted per unit time to the refrigerant, from the heat transfer surface of the cooling unit 2 (inner side of the surfaces, in the cooling unit side surface 2*a,* on which the heat-generating electronic devices 3 are provided) is ordinarily an important factor in determining whether the refrigerant boils or not. The higher the heat density of the electronic devices 3, the greater the heat flux is, and the more readily boiling takes place.

The bubbles 24 generated through boiling can be caused to condense through exchange of heat with refrigerant being at a comparatively low temperature, away from the bottom surface of the cooling unit 2. The refrigerant is warmed by receiving heat from the electronic devices 3, and flows from the refrigerant outlet portion 2*e* through the interior of the refrigerant pipe 40, for instance a radiator hose, to be fed to the radiator 31. In the radiator 31 the refrigerant is cooled through exchange of heat with outside air, and the cooled refrigerant flows again into the refrigerant inlet portion 2*c,* to cool the electronic devices 3.

As described above, the power conversion device 1 of Embodiment 1 of the present invention is provided with the cooling unit 2 that is a prism, the interior of which is hollow, and that has the refrigerant inlet portion 2*c* and the refrigerant outlet portion 2*e,* the cooling unit 2 having, in the interior thereof, the refrigerant channel 2*f* through which the refrigerant flows from the refrigerant inlet portion 2*c* towards the refrigerant outlet portion 2*e;* the electronic devices 3 that are respectively disposed on three or more surfaces on the outside of side surfaces of the cooling unit 2, excluding the refrigerant inlet surface 2*b,* in which the refrigerant inlet portion 2*c* is disposed, and the refrigerant outlet surface 2*d,* in which the refrigerant outlet portion 2*e* is disposed, the electronic devices 3 being cooled by boiling of the refrigerant; and the hollow outer case 4 that covers the electronic devices 3.

In the above configuration, the heat-generating electronic devices 3 are disposed on at least three surfaces on the cooling unit side surface 2*a;* as a result, the power conversion device 1 can be made more compact. The power conversion device 1 can be made yet more compact by arranging the electronic devices 3 over the entire surface. The heat-generating electronic devices 3 can be arranged three-dimensionally; cooling; efficiency is enhanced in that it becomes possible to utilize the cooling surface of the cooling unit 2 more effectively than in the case of a flat structure. In consequence an effect is achieved whereby the footprint necessary to make more compact the power conversion device 1 provided with the cooling unit 2 may be small.

Since the footprint may be smaller than that of a conventional cooling unit 2 having a flat structure, it becomes possible to achieve an effect of reducing the likelihood of interference with other equipment during installation. In particular, space for mounting equipment is limited in a vehicle such as an electric car or hybrid car having an inverter and so forth mounted therein. An effect is elicited as a result in that, by mounting the power conversion device 1 according to Embodiment 1 of the present invention in a vehicle, it becomes possible to secure space for mounting other equipment.

Further, the refrigerant for cooling flows into the refrigerant channel 2f inside the cooling unit 2, and the heat-generating electronic devices 3 are attached to the exterior of the cooling unit 2; as a result, the electronic devices 3 can be cooled without complex routing of the refrigerant channel 2f. Accordingly, a cooling unit 2 can be obtained that has a simple refrigerant channel 2f.

Covering of the heat-generating electronic devices 3 with the outer case 4 allows securing water-proofness in terms of preventing penetration of water from the exterior, and securing hermeticity in terms of -preventing intrusion of flying matter or dust. By making the cooling unit 2 into a three-dimensional shape in a case where the electronic devices 3 are covered by the outer case 4, the contact surface area between the cooling unit 2 and the outer case 4 is smaller, and sealing portions fewer, than in the case of a flat structure. Hermeticity can be enhanced as a result.

in the power conversion device 1 of Embodiment 1 of the present invention a configuration may be adopted in which the electronic device 3 of highest heat density from among the electronic devices 3 is disposed on the outside of the bottom surface from among the side surfaces of the cooling unit 2. Alternatively, the electronic device 3 that generates the largest amount of heat from among the electronic devices 3 may be disposed on the outside of the bottom surface from among the side surfaces of the cooling unit 2.

Figure 5:
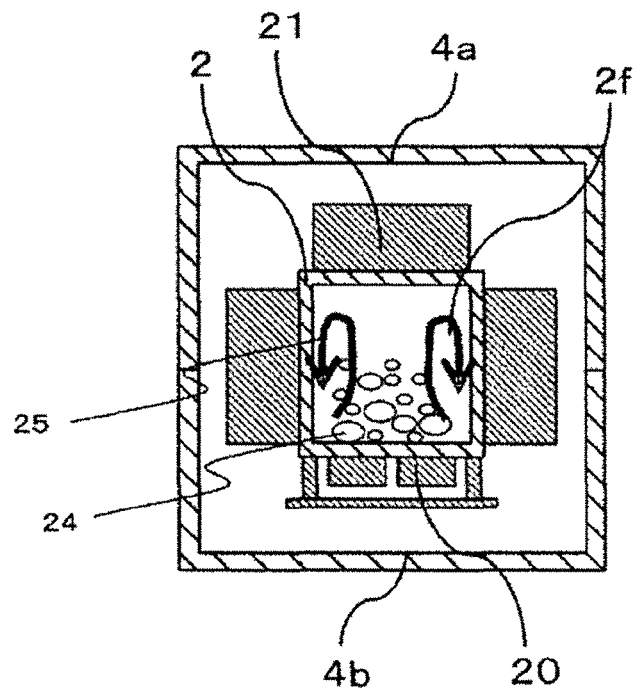
FIG. 5 is a diagram illustrating the flow of refrigerant in a cooling unit of Embodiment 1 of the present invention in a case where an electronic device that generates the largest amount of heat is disposed on the outside of the bottom surface of the cooling unit.

FIG. 5 is a diagram illustrating the flow of refrigerant in the cooling unit 2 of Embodiment 1 of the present invention in a case where the electronic device 3 of highest heat density is disposed on the outside of the bottom surface of the cooling unit 2. in the cooling unit 2 of FIG. 5 the power module 3d is disposed, as the electronic device 3 of highest heat density from among the heat-generating electronic devices 3, on the outside of the bottom surface of the cooling unit side surface 2a. FIG. 5 is a diagram corresponding basically to FIG. 2(*b*), but FIG. 5 includes additionally flow arrows 25 depicting schematically the boiling-derived flow of refrigerant inside the cooling unit 2. Preferably, the interior of the cooling unit 2 is in a state of low flow rate, with a view to promoting boiling in the vicinity of the bottom surface of the cooling unit 2.

In such a configuration, the electronic device 20 of highest heat density is mounted on the outside of the bottom surface; as a result the refrigerant can toe caused to boil in the vicinity of the bottom surface of the cooling unit 2, through transfer of a large amount of heat to the refrigerant inside the refrigerant channel 2f in the vicinity of the bottom surface of the cooling unit 2. In this case, the bubbles generated through boiling rise up by buoyancy, and induce secondary flow as denoted by the flow arrows 25 in FIG. 5. As a result, the heat transfer coefficient is increased, and the cooling efficiency of the electronic devices 3 is enhanced due to this secondary flow, also at the cooling unit side surface 2a excluding the bottom surface. The bubbles 24 generated through boiling can be caused to condense through exchange of heat with refrigerant being at a comparatively low temperature, away from the bottom surface of the cooling unit 2.

in the power conversion device 1 of Embodiment 1 of the present invention a configuration may be adopted in which the electronic device 3 having the lowest heat density from among the electronic devices 3 is disposed on the outside of the top surface from among the side surfaces of the cooling unit 2. Alternatively, the electronic device 3 that generates the largest amount of heat from among the electronic devices 3 may be disposed on the outside of the top surface from among the side surfaces of the cooling unit 2.

In such a configuration, the electronic device 21 having the lowest heat density is provided at the top surface of the cooling unit 2; as a result, it becomes possible to reduce the rise in temperature, in the upper portion of the cooling unit 2, of the air sealed between the cooling unit 2 and the power conversion device 1. Further, the electronic device 21 having the lowest heat density can be prevented from being affected by heat from the electronic device 20 of highest heat density. It becomes accordingly possible to cool the electronic devices 3 efficiently while suppressing adverse effects derived from heat.

Embodiment 2

Figure 6:
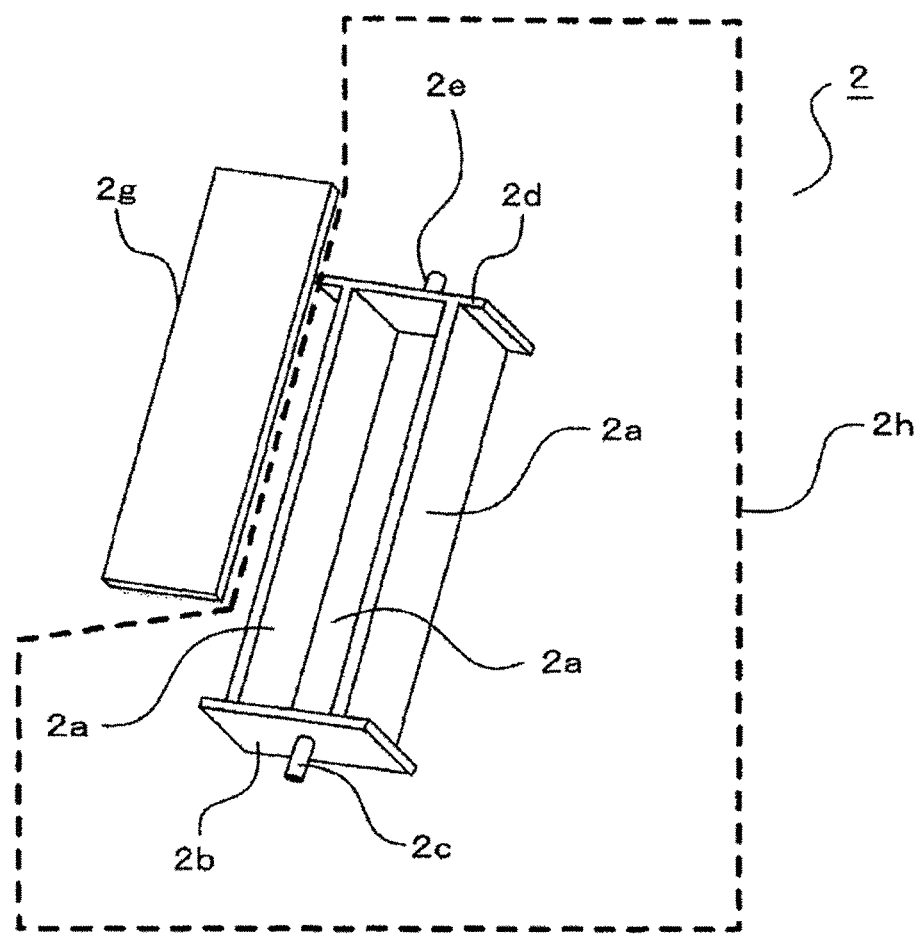
FIG. 6 is an exploded perspective-view diagram of a cooling unit according to Embodiment 2 of the present invention.
Figure 7A:
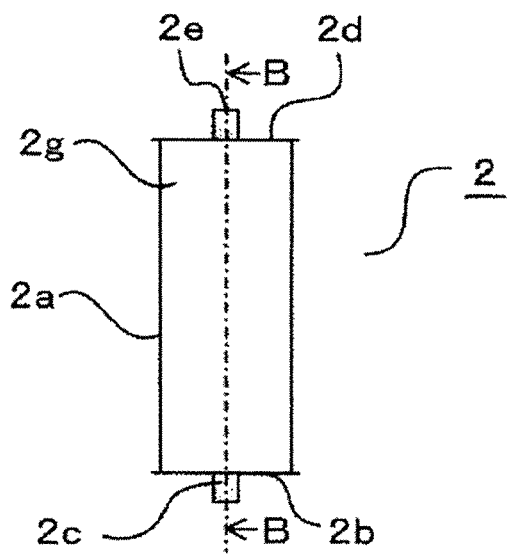
FIG. 7 is a set of a top-view diagram and a B-B cross-sectional diagram of the cooling unit according to Embodiment 2 of the present invention.
Figure 7B:
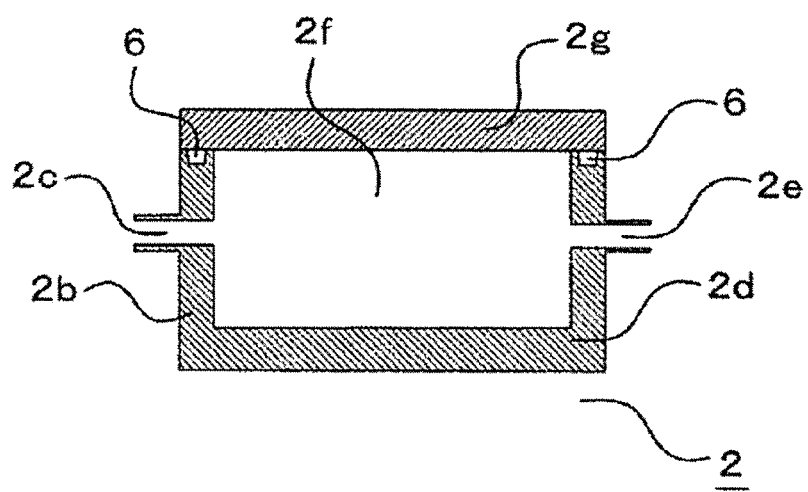
Figure 8:
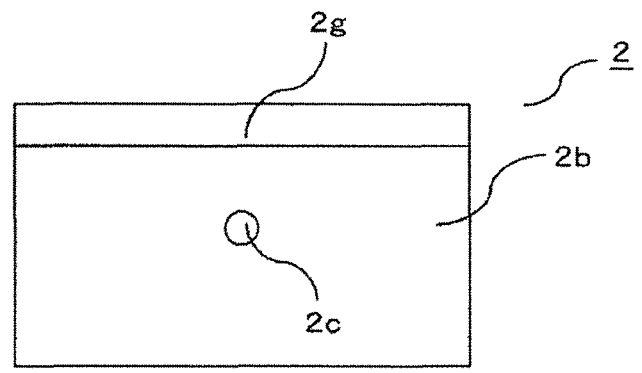
FIG. 8 is a front-view diagram of the cooling unit according to Embodiment 2 of the present invention.

The configuration of the power conversion device 1 according to Embodiment 2 of the present invention will be explained next with reference to FIGS. 6 to 8. FIG. 6 is an exploded perspective-view diagram of a cooling unit 2 according to Embodiment 2 of the present invention. FIG. 7A is a top-view diagram of the cooling unit 2, FIG. 7B is a cross-sectional diagram of the cooling unit 2 along B-B in FIG. 7A, and FIG. 8 is a front-view diagram of the cooling unit 2. In the power conversion device 1 according to Embodiment 1 the structure of an integrally molded cooling unit 2 has been explained as the basic structure of the power conversion device 1. In Embodiment 2 of the present invention, there will be explained a variation of the structure of the cooling unit 2 of the power conversion device 1. The explanation below will focus on differences with respect to Embodiment 1, and identical or corresponding portions will not be explained.

As illustrated in FIG. 6, the cooling unit 2 of the present Embodiment 2 is made up of a lid part 2g and a C-shaped cooling part 2h. The lid part 2g is one plate-like surface that makes up the cooling unit 2 excluding the refrigerant inlet surface 2b, being the surface in which the refrigerant inlet portion 2c is disposed, and the refrigerant outlet surface 2d, being the surface in which the refrigerant outlet portion 2e is disposed. The C-shaped cooling part 2h, which excludes the lid part 2g froth the cooling unit 2, is formed as a separate body from the lid part 2g. The power conversion device 1 of the present Embodiment 2 has the cooling unit 2 in which the lid part. 2g and the C-shaped cooling part 2h are joined to each other.

The C-shaped cooling part 2h is formed through integral molding of the cooling unit side surface 2a, the refrigerant inlet surface 2b, the refrigerant inlet portion 2c, the refrigerant outlet surface 2d and the refrigerant outlet portion 2e. The lid part 2g and the C-shaped cooling part 2h are joined to each other by way of ah interposed sealing member, such as an O-ring, to form the cooling unit 2.

As illustrated in FIG. 7, the refrigerant flows in from the refrigerant inlet portion 2c, passes through the refrigerant channel 2f formed inside the cooling unit 2, and flows towards the refrigerant outlet portion 2e. With a view to preventing leakage of refrigerant out of the cooling unit 2, sealing grooves 6 for arranging the sealing member such as an O-ring are disposed at the top of the C-shaped cooling part 2h. To join the lid part 2g to the C-shaped cooling part 2h, a sealing member such as an O-ring is disposed on the sealing grooves 6, and the C-shaped cooling part 2h and the lid part 2g are joined to each other. As illustrated in FIG. 8, the refrigerant channel 2f is sealed through covering of the top of the cooling unit 2 by the lid part 2g.

The characterizing feature of the power conversion device 1 according to Embodiment 2 of the present invention, thus, is that herein one surface of the side surfaces of the cooling unit 2 excluding the refrigerant inlet surface 2b and the refrigerant outlet surface 2d is configured in the form of a plate-like lid part 2g, such that the cooling unit 2 excluding the lid part 2g is formed, as a body separate from the lid part 2g, through joining of the lid part 2g to the cooling unit 2 excluding the lid part 2g of the cooling unit 2.

In such a configuration, the C-shaped cooling part 2h is formed through integral molding, and accordingly it becomes possible to reduce joining sites at the cooling unit side surface 2a, the refrigerant inlet surface 2b and the refrigerant outlet surface 2d, as compared with joining via respective interposed sealing members at the foregoing surfaces. As a result, an effect is achieved of making it possible to enhance hermeticity, and enhancing water-proofness in terms of preventing penetration of water from the exterior and preventing intrusion of dust or the like.

Through splitting into the C-shaped cooling part 2h and the lid part 2g, further effects are elicited whereby it becomes easier to attach the electronic devices 3 and workability is improved. The lid part 2g need not be limited to the top surface of the cooling unit side surface 2a, and may be any other surface.

Embodiment 3

The configuration of the power conversion device 1 according to Embodiment 3 of the present invention will be explained next with reference to FIGS. 9 to 12. Embodiment 3 of the present invention differs from Embodiment 2 in that now the cooling unit 2 and a middle part 4c of the outer case are integrally molded with each other. The explanation hereafter will deal with dissimilar portions, while identical or corresponding portions will not be explained.

Figure 9:
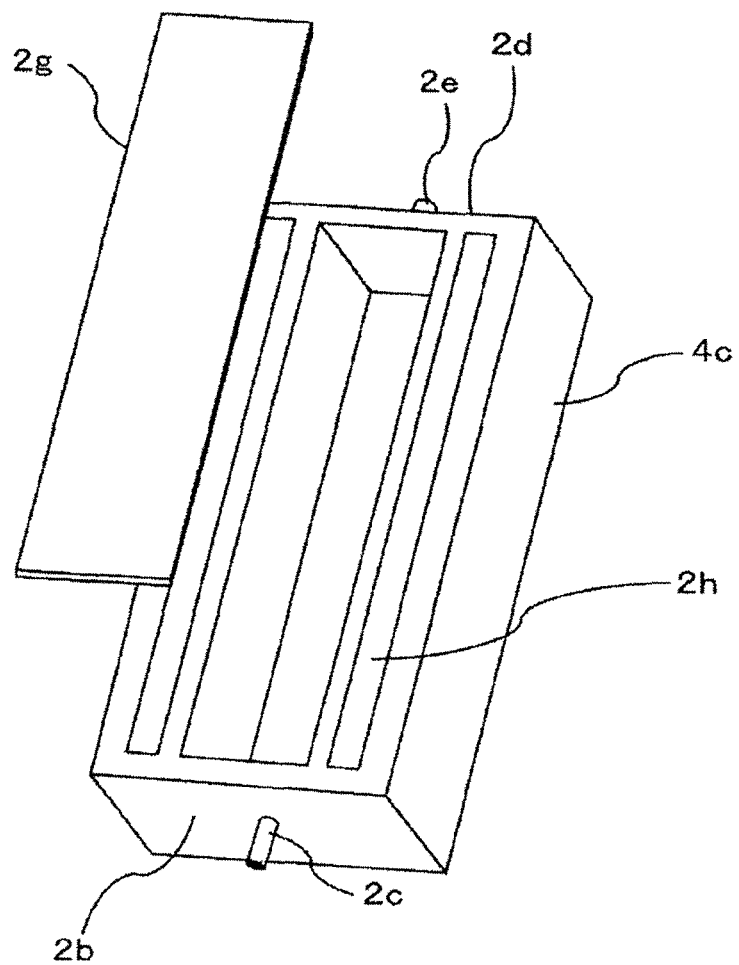
FIG. 9 is an exploded perspective-view diagram of a cooling unit and a middle part according to Embodiment 3 of the present invention.
Figure 10A:
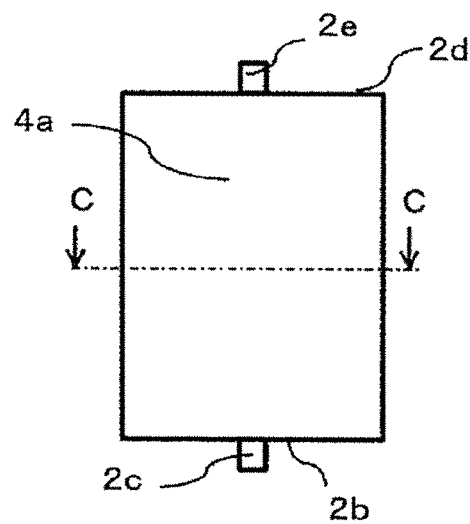
FIG. 10 is a set of a top-view diagram and a C-C cross-sectional diagram of a power conversion device according to Embodiment 3 of the present invention.
Figure 10B:
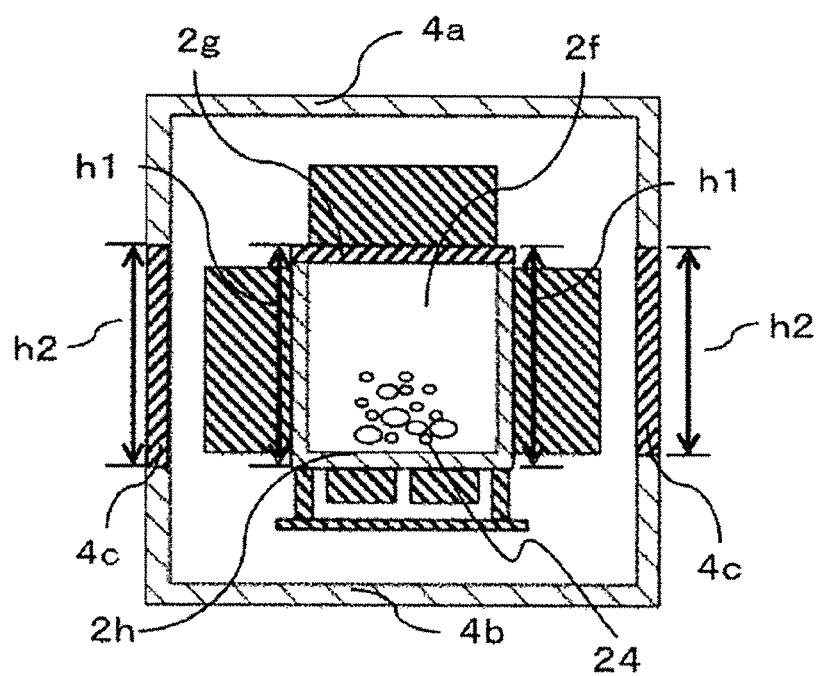

FIG. 9 is an exploded perspective-view diagram of the cooling unit 2 and the middle part 4c of the outer case. FIG. 10A is a top-view diagram of the power conversion device 1 provided with the cooling unit 2 and the middle part 4c of the outer case of FIG. 9, and FIG. 10B is a cross-sectional diagram of the power conversion device 1 along C-C of FIG. 10A. The outer case 4 in Embodiment 3 of the present invention has the middle part 4c formed through molding integrally with the cooling unit 2, the outer case top part 4a joined to the top of the middle part 4c and the outer case bottom part 4b joined to the bottom of the middle part 4c. Two opposing side surfaces of the middle part 4c of the outer case 4 are configured out of the same surfaces as the refrigerant inlet surface 2b and the refrigerant outlet surface 2d of the cooling unit 2. Specifically, the surfaces of the refrigerant inlet surface 2b and the refrigerant outlet surface 2d being the two end surfaces of the cooling unit 2 extend in the horizontal direction, while maintaining the same height, and become connected to the middle part 4c of the outer case 4, as illustrated in FIG. 9.

Further, the height of the two opposing side surfaces of the middle part 4c of the outer case 4, perpendicular to the refrigerant inlet surface 2b and the refrigerant outlet surface 2d, is same as the height of the side surfaces of the cooling unit 2 perpendicular to the refrigerant inlet surface 2b and the refrigerant outlet surface 2d. Thus, a side surface of the middle part 4c of the outer case 4 being the same surface as the refrigerant inlet surface 2b, a side surface being the same surface as the refrigerant outlet surface 2d, and two opposing side surfaces being perpendicular to the refrigerant inlet surface 2b and the refrigerant outlet surface 2d, are formed integrally with the refrigerant inlet surface 2b and the refrigerant outlet surface 2d of the cooling unit 2, and with the side surfaces of the cooling unit 2 perpendicular to the refrigerant inlet surface 2b and the refrigerant outlet surface 2d.

The lid part 2g is joined to the C-shaped cooling part 2h, with the gap between the cooling unit 2 and the outer case 4 being sufficiently wide so as to allow the electronic devices 3 to be disposed therein, as illustrated in FIG. 10B. The height h1 of the surface, facing in the horizontal direction of the cooling unit 2, of the C-shaped cooling part 2h having the lid part 2g joined thereto, and the height h2 of the refrigerant inlet surface 2b, the refrigerant outlet surface 2d and the middle part 4c of the outer case 4, are same.

Accordingly, the shape of the outer case top part 4a and of the outer case bottom part 4b that make up the outer case 4 differs between the present Embodiment 3 and Embodiment 2. The outer case top part 4a and the outer case bottom part 4b are attached from above and below, in a pinching fashion, so as to cover the electronic devices 3. In the present Embodiment 3, thus, the joining surfaces at the time of attachment of the outer case top part 4a and the outer case bottom part 4b to the cooling unit 2 and to the middle part 4c of the outer case lie on respective identical planes, since the heights of the cooling unit 2 and the middle part 4c of the outer case axe same.

The outer case top part 4a and the outer case bottom part 4b are partially recessed in accordance with the shape of the cooling unit 2, at the joining surfaces at the time of pinching attachment of the outer case top part 4a and the outer case bottom part 4b illustrated in FIG. 1 or FIG. 2(b), since the middle part 4c of the outer case is not provided herein. Accordingly, the respective joining surfaces of the outer case top part 4a and of the outer case bottom part 4b do not lie in same planes.

Figure 11:
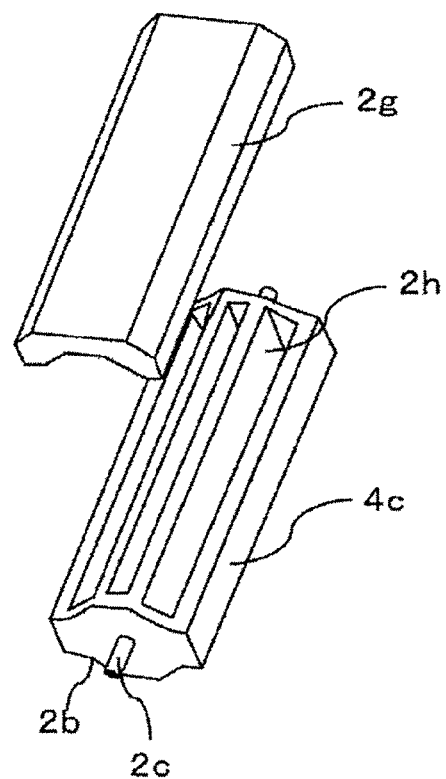
FIG. 11 is an exploded perspective-view diagram of the cooling unit and the middle part according to Embodiment 3 of the present invention.
Figure 12:
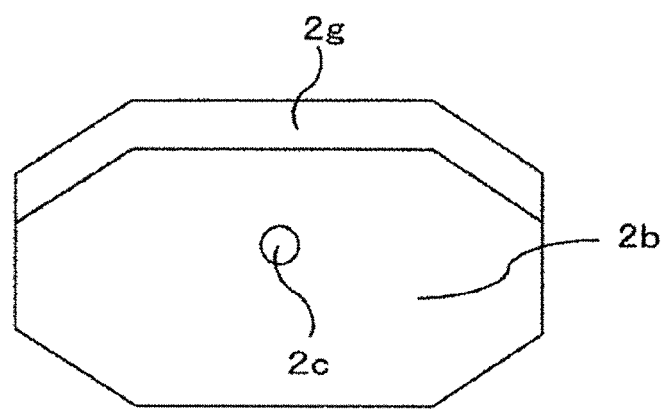
FIG. 12 is a front-view diagram of the cooling unit and the middle part according to Embodiment 3 of the present invention.

FIGS. 11 and 12 are variations of the cooling unit 2 and the middle part 4c of the outer case illustrated in FIGS. 9 and 10. FIG. 11 is an exploded perspective-view diagram of the outer case 4 and the cooling unit 2, and FIG. 12 is a front-view diagram of the outer case 4 and the cooling unit 2. As illustrated in FIGS. 11 and 12, a structure rosy be adopted wherein the height h2 of the side surfaces of the middle part 4c of the outer case perpendicular to the refrigerant inlet surface 2b and the cooling outlet surface 2d is set to be smaller than the height hi of the C-shaped cooling part 2h, with the surfaces of the refrigerant inlet surface 2b and the refrigerant outlet surface 2d extending in the horizontal direction becoming gradually narrower along a straight line or a curved surface, from the top and bottom ends of the refrigerant inlet surface 2b and the refrigerant outlet surface 2d over to the top and bottom ends of the middle part 4c of the outer ease. That is, the C-shaped cooling part 2h and the lid part 2g that make up the cooling unit 2 may be combined to yield a shape with four chamfered corners (rounded shape). Similarly, in the outer case 4 the four corners of the outer case 4 that make up the power conversion device 1 may adopt chamfered shape (rounded shape).

The characterizing feature of the power conversion device 1 according to Embodiment 3 of the present invention, as described above, is that the outer case 4 has the middle part 4c having opposing side surfaces respectively being the same surfaces as the refrigerant inlet surface 2b and the refrigerant outlet surface 2d of the cooling unit 2, and opposing side surfaces perpendicular to the refrigerant inlet surface 2b and the refrigerant outlet surface 2d and having a height equal to or smaller than that of the side surfaces of the cooling unit 2 perpendicular to the refrigerant inlet surface 2b and the refrigerant outlet surface 2d; the outer case top part 4a joined to the top of the middle part 4c; and the outer case bottom part 4b joined to the bottom of the middle part 4c; wherein the middle part 4c is formed integrally with the refrigerant inlet surface 2b, the refrigerant outlet surface 2d of the cooling unit 2, and side surfaces of the cooling unit 2 perpendicular to the refrigerant inlet surface 2b and the refrigerant outlet surface 2d.

In this configuration, the cooling unit 2 and the middle part 4c of the outer case are integrally molded with each other, and accordingly when the outer case top part 4a and the outer case bottom part 4b are attached in a pinching manner, from above and below so as to cover the cooling unit 2 having the electronic devices 3 disposed thereon, the resulting joining surfaces lie on respectively same planes. Accordingly, no recessed shape conforming with the shape of the cooling unit 2 is formed in the outer case top part 4a or the outer case bottom part 4b, and hence it becomes possible to reduce sealing members while facilitating arrangement of the latter. Workability is enhanced as a result. Due to the absence of recessed shapes, hermeticity as well is increased, and there can be reduced the risk of intrusion of water from outside.

Contact thermal resistance is large at joining surfaces in a case where the outer case 4 and the cooling unit 2 are attached to each other, not through integral molding of the cooling unit 2 and the middle part 4c of the outer case. However, in a case where the cooling unit 2 and the middle part 4c of the outer case are integrally molded with each other, heat is transmitted readily, by heat conduction, from the cooling unit 2 to the outer case 4, and the electronic devices 3 can be better cooled, through dissipation of heat towards the exterior when the temperature of outside air is lower than the temperature of the cooling unit 2.

A structure is adopted wherein faces extending in the horizontal direction become gradually narrower in the height direction, along a straight line or a curved surface, from the top and bottom ends of the refrigerant inlet surface 2b and the refrigerant outlet surface 2d over to the top and bottom ends of the middle part 4c of the outer case. It becomes accordingly possible to reduce the volume of the power conversion device 1. Weight reductions can be achieved as a result. By similarly forming the outer case 4 to a shape having four corners thereof chamfered (rounded shape), it becomes possible to further reduce the weight of the power conversion device 1, making the latter more compact.

In this structure, faces extending in the horizontal direction become gradually narrower in the height direction, along a straight line or a curved surface, from the top and bottom ends of the refrigerant inlet surface 2b and the refrigerant outlet surface 2d over to the top and bottom ends of the middle part 4c of the outer case 4. Accordingly, there are no step-wise level differences, and hence it becomes possible to arrange the sealing member easily, and to not only increase workability but also reduce the risk of intrusion of water from the exterior. For instance, the lid part 2g and the outer case 4 may be fixed to each other by brazing, welding, bolting, screwing or riveting, although this is not illustrated in the figures.

Embodiment 4

The configuration of the power conversion device 1 according to Embodiment 4 of the present invention will be explained next with reference to FIG. 13. FIG. 13 is a set of a top-view diagram and a cross-sectional diagram along D-D of the cooling unit 2 and the middle part 4c according to Embodiment 4 of the present invention. In the power conversion device 1 according to Embodiment 3, the cooling unit 2 and the middle part 4c of the outer case were integrally molded, and the outer case top part 4a and the outer ease bottom part 4b were set to flank the cooling unit 2 from above and below. The structures of the integrally molded cooling unit 2, middle part 4c of the outer case and top of the C-shaped cooling part 2h in Embodiment 4 of the present invention are different from those illustrated in Embodiment 3. Other features and functions are same, and thus the explanation will focus on features that different from those of Embodiment 3.

Figure 13A:
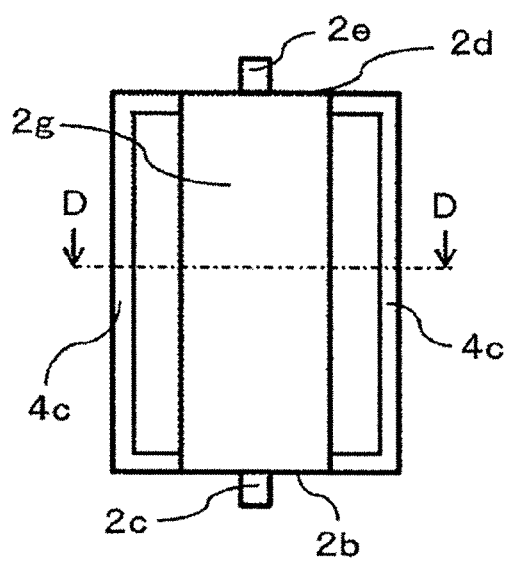
FIG. 13 is a set of a top-view diagram and a D-D cross-sectional diagram of a power conversion device according to Embodiment 4 of the present invention.
Figure 13B:
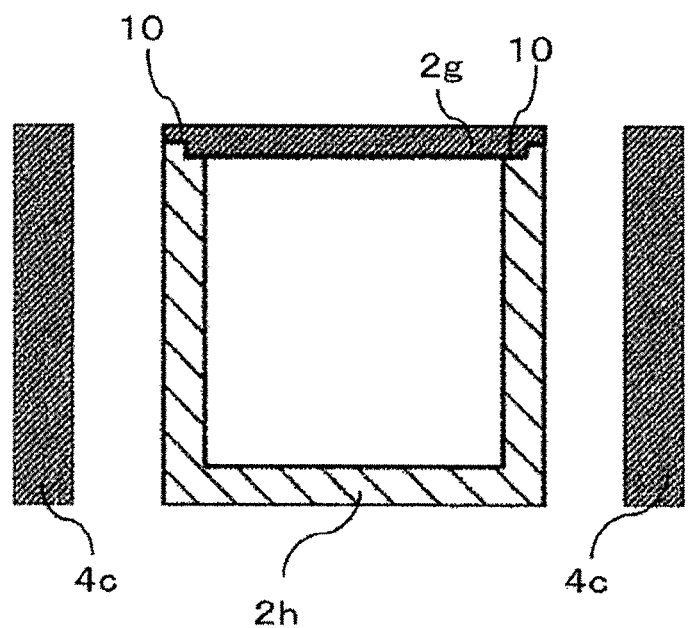

A step portion 10 for joining to the lid part 2g, worked to a stepped shape, is provided on the four sides at the top of the C-shaped cooling part 2h in Embodiment 4. FIG. 13A illustrates a top-view diagram of the cooling unit 2 and the middle part 4c of the outer case 4, FIG. 13B is a cross-sectional diagram of the cooling unit 2 and the middle part 4c of the outer case 4 along D-D of FIG. 13A. As illustrated in FIG. 13B, the step portion 10 is present, inwardly recessed, at part of the top portion of the C-shaped cooling part 2h. The lid part 2g is fitted onto the step portion 10 of the C-shaped cooling part 2h, and thereafter friction stir welding is carried out at the joining sites of the C-shaped cooling part 2h and the lid part 2g, to join the foregoing two.

Herein, friction stir welding denotes a technology wherein a cylindrical tool (connection tool) is inserted, while rotating, into a joining section with a member, and the tool is displaced along the joining section, such that the member becomes softened on account of the friction generated as a result, and is stirred/joined while still being a solid.

As described above, in the power conversion device 1 according to Embodiment 4 of the present invention the lid part 2g and the C-shaped cooling part 2h being the cooling unit 2 excluding the lid part 2g are formed through joining by friction stir welding. Such being the case, the lid part 2g and the C-shaped cooling part 2h need not be joined via interposed sealing members. Accordingly, the sealing grooves 6 for a sealing member such as an O-ring, or holes for bolt fastening, are unnecessary, and plate thickness can be reduced as a result.

Such a configuration allows reducing the size and weight of the power conversion device 1, and reducing the number of number of parts such as sealing members. Friction stir welding is a bonding method for metal bonding that allows reducing the risk of for instance water leakage derived from degradation of sealing members or the like.

Embodiment 5

The configuration of the power conversion device 1 according to Embodiment 5 of the present invention will be explained next with reference to FIG. 14. FIG. 14 is a set of a top-view diagram and an E-E cross-sectional diagram of the power conversion device 1. Embodiment 5 of the present invention is variation in which the plate thickness at the bottom surface of the cooling unit 2 of the power conversion device 1 has now been reduced. The explanation below will focus on differences with respect to Embodiment 1, and identical or corresponding portions will not be explained.

Figure 14A:
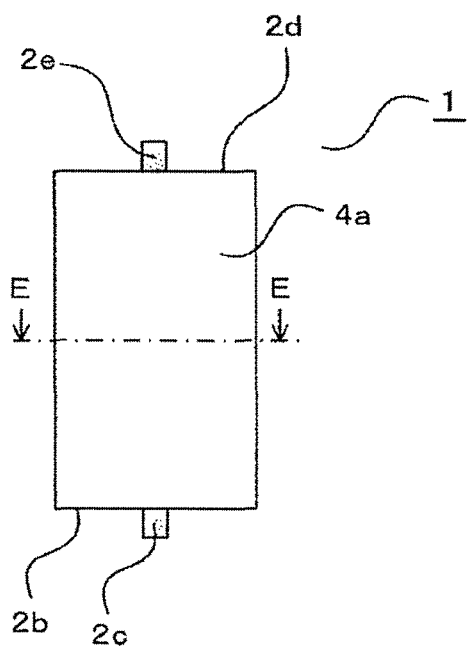
FIG. 14 is a set of a top-view diagram and an E-E cross-sectional diagram of a power conversion device according to Embodiment 5 of the present invention.
Figure 14B:
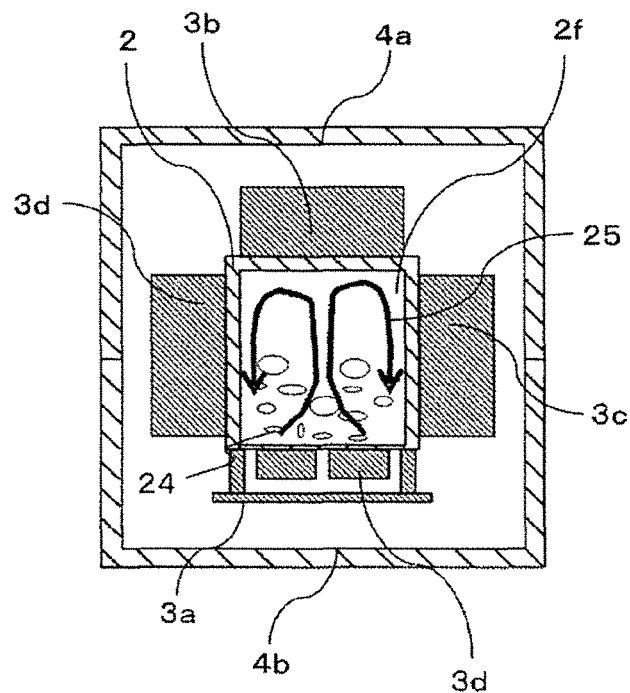

FIG. 14A is a top-view diagram of the power conversion device 1. FIG. 14B is a cross-sectional diagram of the power conversion device 1 along E-E of FIG. 14A. In the power conversion device 1 according to Embodiment 5 of the present invention, as illustrated in FIG. 14B, the electronic device 20 of highest heat density from among the plurality of electronic devices 3 disposed in the power conversion device 1 is arranged on the outside of the bottom surface of the cooling unit 2, and moreover, the plate thickness at the bottom surface, from among the side surfaces of the cooling unit 2, is smaller than that of other surfaces.

Thus, the characterizing feature of the power conversion device 1 of Embodiment 5 of the present invention is that the place thickness of the cooling unit 2 at the bottom surface, from among the side surfaces, is smaller than that of other side surfaces.

By virtue of such a configuration, in the power conversion device 1 of Embodiment 5 of the present invention, heat from the electronic device 3 mounted on the outside of the bottom surface of the cooling unit 2 is transmitted readily to the refrigerant inside the refrigerant channel 2f, in the vicinity of the bottom surface of the cooling unit 2, and boiling of the refrigerant can be thus promoted, due to the feature in which the plate thickness of the cooling unit 2 at the bottom surface, from among the side surfaces, is smaller than that of other side surfaces.

Embodiment 6

The configuration of the power conversion device 1 according to Embodiment 6 of the present invention will be explained next with reference to FIG. 15. FIG. 15 is a set of a top-view diagram and an F-F cross-sectional diagram of the power conversion device 1. Embodiment 6 of the present invention differs from Embodiment 1 of the present invention in that now cooling fins 26 are provided. The explanation below will focus on differences with respect to Embodiment 1, and identical or corresponding portions will not be explained.

Figure 15A:
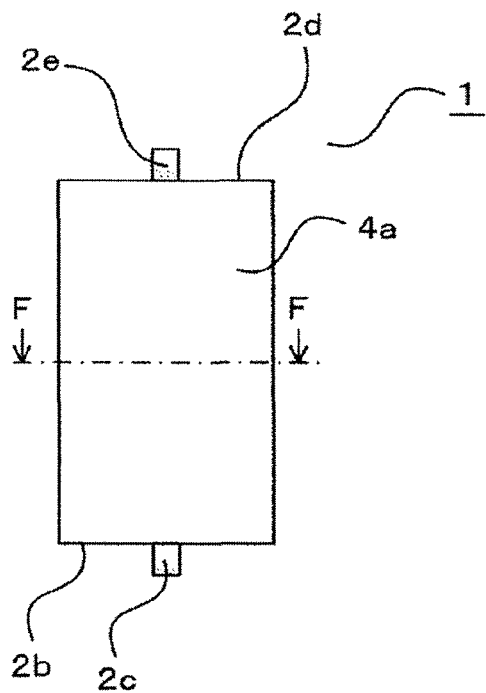
FIG. 15 is a set of a top-view diagram and an F-F cross-sectional diagram of a power conversion device according to Embodiment 6 of the present invention.
Figure 15B:
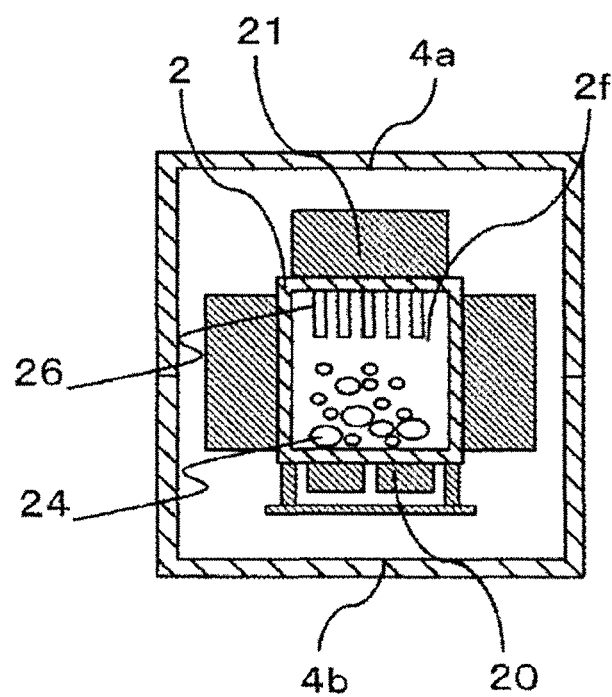

FIG. 15A is a top-view diagram of the power conversion device 1. FIG. 15B is a cross-sectional diagram of the power conversion device 1 along F-F of FIG. 15A. in the power conversion device 1 according to Embodiment 6 of the present invention, cooling fins 26 are provided on the inner side of the top surface of the cooling unit 2, as illustrated in FIG. 15B.

Thus, the characterizing feature of the power conversion device 1 of Embodiment 6 of the present invention is that the fins 26 are provided on the inner side of the top surface, among the side surfaces of the cooling unit 2.

By virtue of such a configuration there is increased a heat dissipation characteristic of the top surface of the cooling unit 2, and accordingly it becomes possible to prevent that the electronic device 21 disposed on the top surface of the cooling unit 2 should be brought to or above a prescribed temperature. In a case where among the electronic devices 3 disposed on the remaining surfaces there is similarly an electronic device the temperature of which rises to or above a prescribed temperature, the cooling fins 26 may be provided on the inner side of the surface, of the cooling unit 2, having provided thereon the electronic device 3 the temperature of which rises to or above a prescribed temperature. The cooling fins 26 may be one fin or a plurality of fins. The number of cooling fins 26 may be modified as appropriate in accordance with the required heat dissipation characteristic.

The cooling fins 26 are not limited to comb-type fins disposed parallelly to the flow, and may be cylindrical pin fins, prismatic pin fins, offset fins, corrugated fins or the like.

Embodiment 7

The configuration of the power conversion device 1 according to Embodiment 7 of the present invention will be explained next with reference to FIG. 16. FIG. 16 is a set of a top-view diagram and a G-G cross-sectional diagram of the power conversion device 1. Embodiment 7 of the present invention differs from Embodiment 1 of the present invention in that now there are provided conductor rods 11. The explanation below will focus on differences with respect to Embodiment 1, and identical or corresponding portions will not be explained.

Figure 16A:
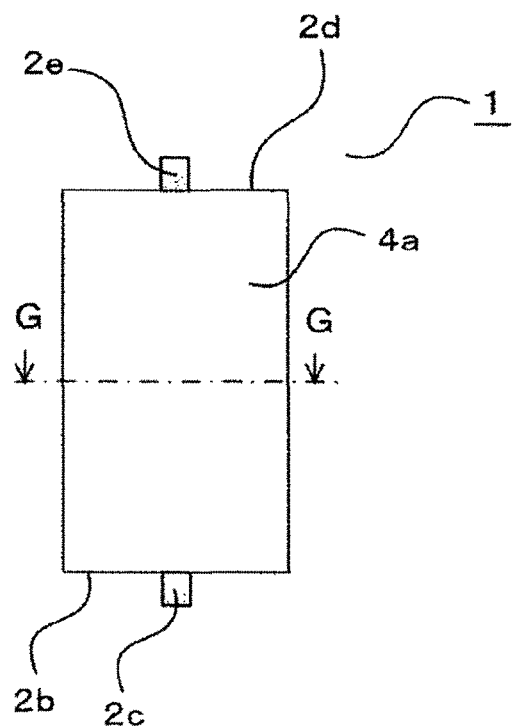
FIG. 16 is a set of a top-view diagram and a G-G cross-sectional diagram of a power conversion device according to Embodiment 7 of the present invention.
Figure 16B:
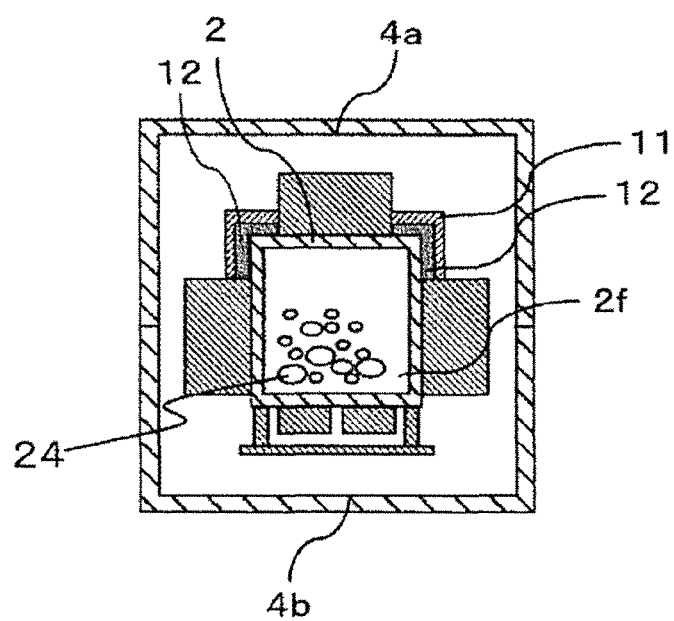

FIG. 16A is a top-view diagram of the power conversion device 1. FIG. 16B is a cross-sectional diagram of the power conversion device 1 along G-G of FIG. 16A. The power conversion device 1 according to Embodiment 7 of the present invention is characterized by being provided with conductor rods 11 that connect at least two electronic devices 3 to each other, and insulating members 12 provided in the gap between the conductor rods 11 and the cooling unit 2, as illustrated in FIG. 16B. The insulating members 12 prevent short-circuits between the conductor rods 11 and the cooling unit 2. Copper, aluminum or the like is used in the conductor rods 11.

In such a configuration, the insulating members 12 are disposed in the gap between the conductor rods 11 and the cooling unit 2, and as a result heat is transferred from the heat-generating conductor rods 11 to the cooling unit 2 better than in a case where the insulating members 12 are absent. That is because the thermal conductivity of the insulating members 12, even when being for instance of plastic or silicon rubber, is still very much larger than the thermal conductivity of air. It becomes accordingly possible to prevent rises in the temperature of the conductor rods 11 themselves, and to cool down the conductor rods 11 efficiently.

Embodiment 8

The configuration of the power conversion device 1 according to Embodiment 8 of the present invention will be explained next with reference to FIG. 17. FIG. 17 is a set of a top-view diagram and an H-H cross-sectional diagram of the power conversion device 1. Embodiment 8 of the present invention differs from Embodiment 1 of the present invention in that now projections 13 are integrally molded with the cooling unit 2 of Embodiment 1. The explanation below will focus on differences with respect to Embodiment 1, and identical or corresponding portions will not be explained.

Figure 17A:
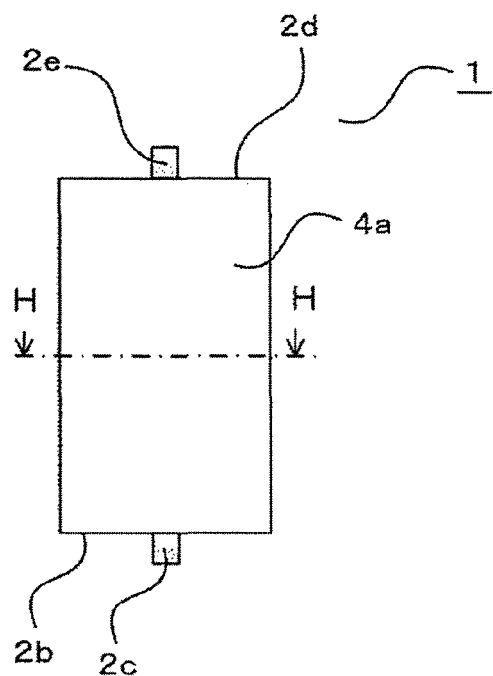
FIG. 17 is a set of a top-view diagram and an H-H cross-sectional diagram of a power conversion device according to Embodiment 8 of the present invention.
Figure 17B:
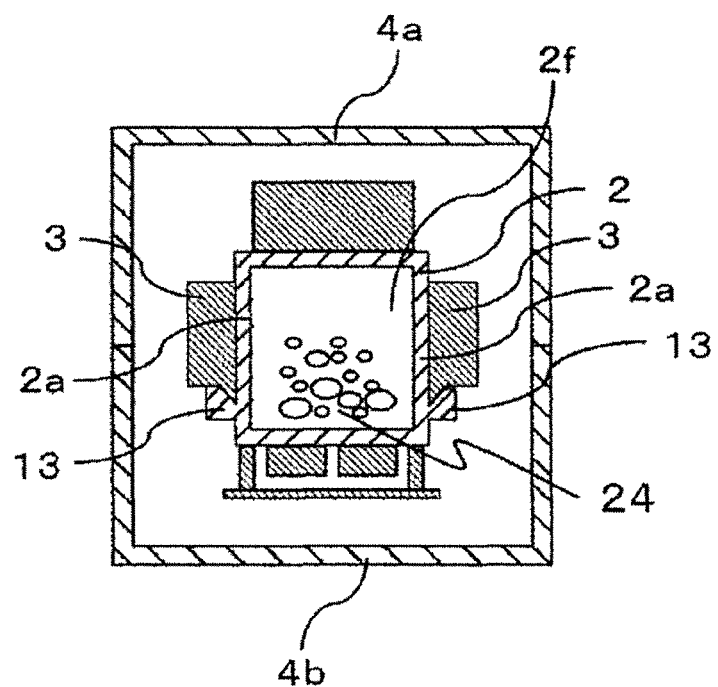

FIG. 17A is a top-view diagram of the power conversion device 1. FIG. 17B is a cross-sectional diagram of the power conversion device 1 along H-H of FIG. 17A. As illustrated in FIG. 17B, the cooling unit 2 according to Embodiment 8 of the present invention has projections 13, for fitting of the electronic devices 3, provided integrally molded at two surfaces of the cooling unit side surface 2a, mutually opposing in the horizontal direction, the two surfaces being located at outer lower sections of the cooling unit side surface 2a. Depressions for fitting with the electronic devices 3 are provided at the top of the projections 13. Meanwhile, protrusions for fitting with the depressions are provided in the electronic devices 3. Herein it suffices that the cooling unit 2 has a projection 13 on the outside of at least one side surface from among the two opposing surfaces of the cooling unit side surface 2a in the horizontal direction.

A characterizing feature of the cooling unit 2 is thus having a projection 13 for fitting of an electronic device 3 on the outside of at least one side surface.

In such a configuration, the electronic devices 3 sire -supported by the projections 13 provided at the outer lower portion of the cooling unit side surface 2a, during the operation of fitting the electronic devices 3 onto the projections 13, and accordingly the electronic devices 3 can be fastened in a simple manner to the cooling unit 2 by way of bolts or the like. Workability daring assembly is enhanced as a result. Further, the number of parts can be reduced through integral molding of the cooling unit 2 and the projections 13.

Embodiment 9

The configuration of the power conversion device 1 according to Embodiment 9 of the present invention will be explained next with reference to FIG. 18. FIG. 18 is a set of a front-view diagram and an I-I cross-sectional diagram of the cooling unit 2 according to Embodiment 9 of the present invention. Embodiment 9 of the present invention differs from Embodiment 1 of the present invention in that now a partition 14 is disposed inside the cooling unit 2, and the refrigerant inlet portion. 2c and the refrigerant outlet portion 2e are disposed on a same surface of the cooling unit 2. The explanation below will focus on differences with respect to Embodiment 1, and identical or corresponding portions will not be explained.

Figure 18A:
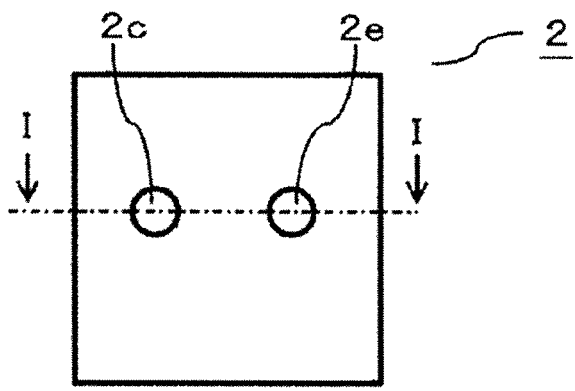
FIG. 18 is a set of a top-view diagram and an I-I cross-sectional diagram of a power conversion device according to Embodiment 9 of the present invention.
Figure 18B:
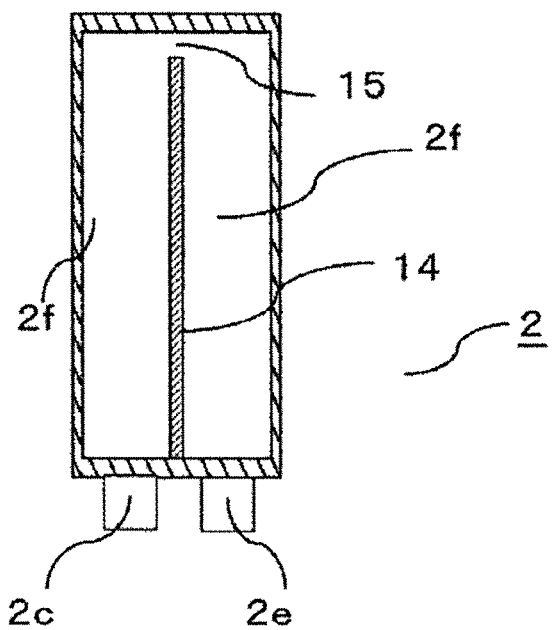

FIG. 18A is a front-view diagram of the cooling unit 2, illustrating a cross-sectional position I-I. FIG. 18B is a cross-sectional diagram of the cooling unit 2 along I-I in FIG. 18A. As illustrated in FIG. 18A, the refrigerant inlet portion 2c and the refrigerant outlet portion 2e are disposed on a same surface of the surfaces constituting the cooling unit 2. In order to bisect the refrigerant channel 2f in the vertical direction into a first region and a second region, there is provided the partition 14 that splits the refrigerant channel 2f into the first-region in contact with the refrigerant inlet portion 2c and into the second region in contact with the refrigerant outlet portion 2e, as illustrated in FIG. 18B.

Three sides from among the four sides that make up the partition 14 are attached to the surfaces that make up the cooling unit 2, such that a gap 15 through which the refrigerant can pass is formed between the remaining side of the partition 14 and a surface that constitutes the cooling unit 2. The refrigerant inlet portion 2c and the refrigerant outlet portion 2e are provided on a same surface, being the surface opposing the surface to which the partition 14 is not attached, among the surfaces that make up the cooling unit 2. That is, the surface opposing the surface of the cooling unit 2 at which the refrigerant inlet portion 2c and the refrigerant outlet portion 2e are disposed is not in contact with the partition 14; instead, the gap 15 is formed between the former surface and the partition 14. The partition 14 is attached to the other surfaces of the cooling unit 2, excluding the gap 15.

The refrigerant flowing from the refrigerant inlet portion 2c into the refrigerant channel 2f inside the cooling unit 2 passes through the gap 15 and is discharged out of the refrigerant outlet portion 2e, along a U-shaped trajectory. The gap 15 is formed at the surface, of the cooling unit 2, on the side opposite the surface where the refrigerant inlet portion 2c and the refrigerant outlet portion 2e are disposed. It becomes accordingly possible to prevent by-passing from the refrigerant inlet portion 2c to the refrigerant outlet portion 2e.

The characterizing feature of the power conversion device 1 according to Embodiment 9 of the present invention, as described above, is that the refrigerant inlet portion 2c and the refrigerant outlet portion 2e are provided on one same surface of the cooling unit 2, and the latter has the partition 14 that splits the refrigerant channel into a first region in contact with the refrigerant inlet portion 2c and into a second region in contact with the refrigerant outlet portion 2e, wherein the partition 14 forms a gap through which the refrigerant flows, between the partition 14 and a surface of the cooling unit 2 opposing the above same surface.

In such a configuration, the refrigerant inlet portion 2c and the refrigerant outlet port ion 2e are disposed on a same surface of the cooling unit 2, and accordingly the radiator hose can be connected easily. This results in enhanced workability for instance in a case where the power conversion device 1 is to be mounted in a small space, such as the engine room of a vehicle.

The partition 14 is disposed in the vertical direction, for bisection into left and right regions, but may be disposed in the horizontal direction, for bisection into top and bottom regions. In the case of vertically bisected regions the refrigerant may be caused to flow through either a top or a bottom refrigerant pipe, but preferably the refrigerant is caused to flow from the bottom upwards. The partition 14 may be joined to the cooling unit 2 by screws or the like, or may be integrally molded with the cooling unit 2.

In the present invention various embodiments can be combined freely with each other, and the embodiments may be modified and omitted as appropriate, within the scope of the invention.

REFERENCE SIGNS LIST

1 Power conversion device
2 Cooling unit
2b Refrigerant inlet surface
2c Refrigerant inlet portion
2d Refrigerant outlet surface
2e Refrigerant outlet portion
2f Refrigerant channel
2g Lid part
3 Electronic device
4 Outer case
4c Middle part
11 Conductor rod
12 Insulating member
13 Projection
14 Partition
15 Gap
20 Electronic device of highest heat density
21 Electronic device of lowest heat density

The invention claimed is:

1. A power conversion device, comprising:
a cooling unit that is a prism, the interior of which is hollow, and that has a refrigerant inlet portion and a refrigerant outlet portion, the cooling unit having, in the interior thereof, a refrigerant channel through which a refrigerant flows from the refrigerant inlet portion towards the refrigerant outlet portion;
electronic devices that are respectively disposed on three or more side surfaces of the cooling unit excluding a refrigerant inlet surface, in which the refrigerant inlet portion is disposed, and a refrigerant outlet surface, in which the refrigerant outlet portion is disposed, the electronic devices being cooled by boiling of the refrigerant; and
a hollow outer case that covers the electronic devices, wherein the electronic device of highest heat density or largest amount of heat from among the electronic devices is covered by the hollow outer case and disposed on a lowest horizontal surface, from among the side surfaces of the cooling unit.

2. The power conversion device of claim 1, wherein plate thickness of the lowest horizontal surface, from among the side surfaces, is smaller than that of other side surfaces of the cooling unit.

3. The power conversion device of claim 1, wherein the electronic device of lowest heat density from among the electronic devices is disposed on an outside of a top surface, from among the side surfaces of the cooling unit.

4. The power conversion device of claim 1, wherein one surface of the side surfaces of the cooling unit excluding the refrigerant inlet surface and the refrigerant outlet surface, is configured in the form of a plate-like lid part, such that the cooling unit excluding the lid part is formed as a body separate from the lid part, with the cooling unit being formed by joining the lid part to the cooling unit excluding the lid part.

5. The power conversion device of claim 1, wherein a fin is provided on an inner side of a top surface, among the side surfaces of the cooling unit.

6. The power conversion device of claim 1, wherein
the refrigerant inlet portion and the refrigerant outlet portion are provided on one same surface of the cooling unit, and the cooling unit has a partition that splits the refrigerant channel into a first region that is in contact with the refrigerant inlet portion and into a second region that is in contact with the refrigerant outlet portion; and the partition forms a gap, through which the refrigerant flows, between the partition and a surface of the cooling unit opposing the same surface.

7. The power conversion device of claim 2, wherein the electronic device of lowest heat density from among the electronic devices is disposed on an outside of a top surface, from among the side surfaces of the cooling unit.

8. The power conversion device of claim 1, wherein from among the electronic devices, the electronic device disposed on the lowest horizontal surface, from among the side surfaces of the cooling unit, is a power module.

9. The power conversion device of claim 1,
wherein from among the electronic devices, the electronic device disposed on an outside of a side surface is a control circuit or a driving circuit.

10. The power conversion device of claim 1,
wherein from among the electronic devices, the electronic device that is disposed on an outside of a side surface is a capacitor or a step-down converter.

* * * * *